United States Patent
Yamada

(10) Patent No.: US 7,629,092 B2
(45) Date of Patent: Dec. 8, 2009

(54) EXPOSURE SYSTEM, EXPOSURE METHOD AND SEMICONDUCTOR DEVICE MANUFACTURING METHOD

(75) Inventor: Keiji Yamada, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 631 days.

(21) Appl. No.: 11/312,588

(22) Filed: Dec. 21, 2005

(65) Prior Publication Data

US 2007/0070314 A1    Mar. 29, 2007

(30) Foreign Application Priority Data

Sep. 27, 2005    (JP)    ............................. 2005-280667

(51) Int. Cl.
   *G06F 9/00*    (2006.01)
   *G03C 5/00*    (2006.01)
(52) U.S. Cl. .......................... 430/30; 430/296; 430/942
(58) Field of Classification Search .................. 430/30, 430/296, 942
   See application file for complete search history.

(56) References Cited

U.S. PATENT DOCUMENTS 7,205,078 B2 *    4/2007    Osawa et al. .................. 430/30

FOREIGN PATENT DOCUMENTS

JP    11-329961    11/1999

* cited by examiner

*Primary Examiner*—Christopher G Young
(74) *Attorney, Agent, or Firm*—Westerman, Hattori, Daniels & Adrian, LLP

(57) ABSTRACT

In performing exposure for forming patterns being fine as well as having great density difference, adequate corrections are to be enabled for suppressing the influence from peripheries of these patterns to be a minimum and for suppressing the dimension variation within the plane of semiconductor substrate or among semiconductor substrates to a minimum. So-called lower-layer corrections are executed, in order to suppress the three-dimensional influence, namely the influence of the film-thickness distribution of a lower-layer structure body lying under a subject film to be processed with a resist. A pattern-correcting portion adjusts the amount of exposure such that it cancels the in-plane film-thickness distribution of the lower-layer structure body in respective exposure regions.

11 Claims, 8 Drawing Sheets

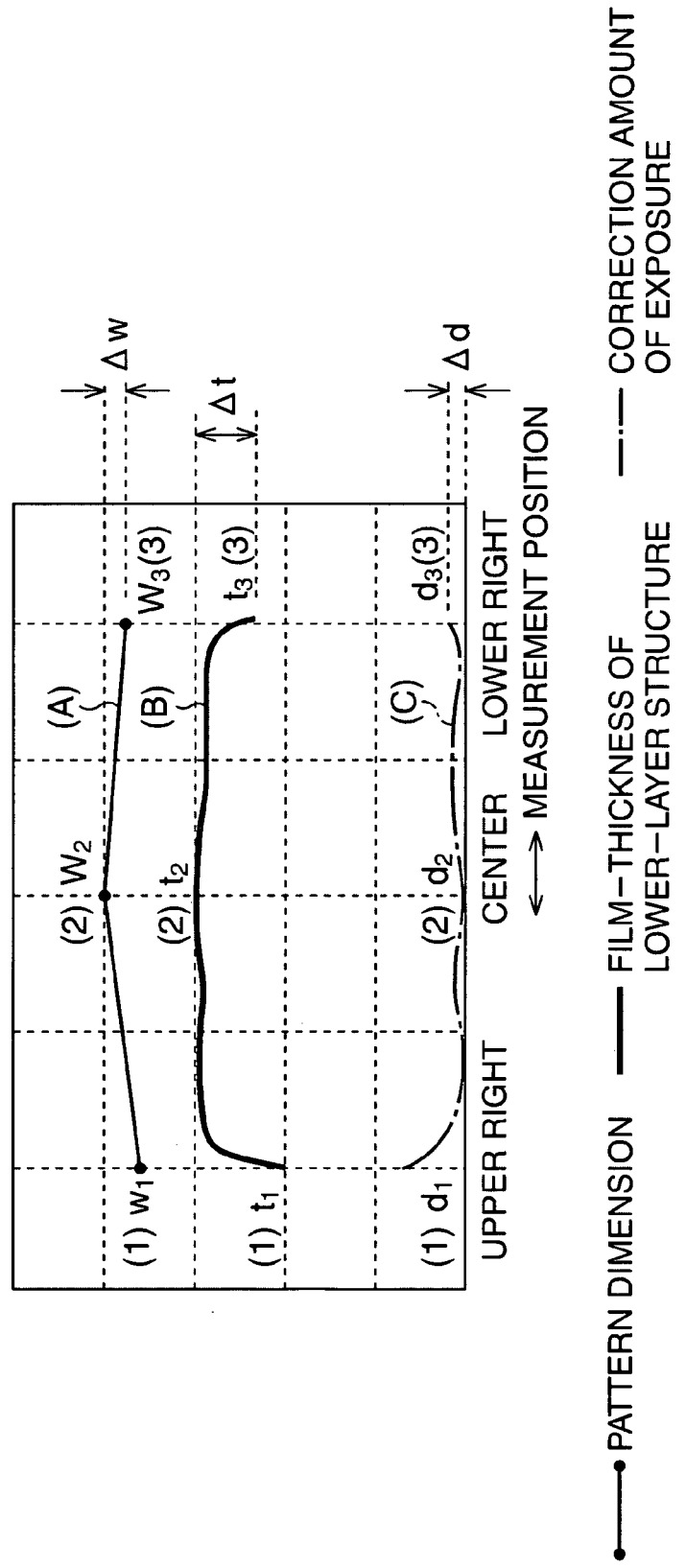

EXPOSURE SYSTEM, EXPOSURE METHOD AND SEMICONDUCTOR DEVICE MANUFACTURING METHOD

CROSS-REFERENCE TO RELATED APPLICATIONS

This application is based upon and claims the benefit of priority from the prior Japanese Patent Application No. 2005-280667, filed on Sep. 27, 2005, the entire contents of which are incorporated herein by reference.

BACKGROUND OF THE INVENTION

1. Field of the Invention

The present invention relates to an exposure system, an exposure method and a semiconductor device manufacturing method for exposing pattern-wise the resist formed on a semiconductor substrate to form a predetermined pattern.

2. Description of the Related Art

In recent years, there have been advances in making structures such as various elements in semiconductor devices yet finer and highly integrated. In order to meet such requirements of being finer and highly integrated, there has been needed the pattern dimension of 200 nm or less and further 100 nm or less, in semiconductor chips during electron-beam exposure, as well as significantly narrow gaps between those patterns.

Recently, to cope with the increase in pattern densities, so-called proximity-effect corrections such as an area-density method are carried out, so as to enable exposure, taking into account influences from surrounding patterns proximate to these patterns (for example, patterns formed within the range of a few micrometers from these patterns). In this case, it is necessary to extremely precisely carry out proximity-effect correction, since there are increased pattern density differences in each pattern alignment, as compared with the case hitherto.

[Patent Document 1] Japanese Patent Application Laid-open No. Hei 11-329961

However, the advances in making structures such as various elements in semiconductor devices yet finer and highly integrated pose difficulties in achieving sufficient exposure correction only with parameters to be empirically determined using samples, as backward scattering factors for the proximity-effect correction.

Patent Document 1 discloses a technique which prepares plural exposure maps of different conditions and types and corrects the amount of exposure on the basis of the exposure maps. However, even with this technique, it is difficult to achieve sufficient exposure correction, in the event of carrying out proximity-effect corrections using the exposure maps, as stated above.

SUMMARY OF THE INVENTION

The present invention has been made in view of the aforementioned problems and aims to provide a exposure system, an exposure method and a semiconductor-device manufacturing method which, in the event of exposing patterns being fine and having great density differences, enables realizing of adequate corrections in such a manner as to restrict any influence from peripheries of these patterns to be a minimum and restrict the dimension variation within the plane of semiconductor substrate or among semiconductor substrates to be a minimum. Thereby it is made possible to form patterns with desired dimensions to the extent possible so as to realize reliable semiconductor devices capable of meeting the requirements of making structures such as various elements in semiconductor devices being yet finer and highly integrated.

The exposure system according to the present invention is a exposure system for exposing pattern-wise the resist formed on a semiconductor substrate to form a predetermined pattern and includes; a film thickness measuring unit for measuring the thickness of a lower layer structure body lying under a subject film to be processed with the resist, at positions within the plane of the lower layer structure body, in the event of exposing the pattern; a exposure device for exposing pattern-wise the resist to form the pattern; and an exposure correcting unit for correcting the amount of exposure in the exposure device, wherein the exposure correcting unit corrects the amount of exposure such that it cancels the amount of reflection of exposure based on the in-plane film thickness distribution of the lower layer structure body by use of the film thicknesses of the lower layer structure body measured by the film thickness measuring unit.

The exposure method according to the present invention is a exposure method for exposing pattern-wise the resist formed on a semiconductor substrate to form a predetermined pattern, the exposure method including the steps of: measuring the film thickness of a lower layer structure body lying under a subject film to be processed with the resist, at respective positions within the plane thereof, in the event of exposing the pattern; correcting the amount of exposure such that it cancels the amount of reflection of exposure based on the in-plane film thickness distribution of the lower layer structure body by use of the film thicknesses of the lower layer structure body measured by the film thickness measuring unit; and exposing pattern-wise the resist to form the pattern based on the corrected amount of exposure.

The semiconductor device manufacturing method according to the present invention is a semiconductor device manufacturing method including the steps of: measuring the film thickness of a lower layer structure body lying under a subject film to be processed with a resist, at positions within the plane thereof, in the event of exposing pattern-wise the resist formed on a semiconductor substrate to form a predetermined pattern; correcting the amount of exposure such that it cancels the amount of reflection of exposure based on the in-plane film thickness distribution of the lower layer structure body by use of the film thicknesses of the lower layer structure body measured by the film thickness measuring unit, when the lower layer structure body is made of a material with a higher reflectivity with respect to exposure than that of the film to be processed; exposing pattern-wise the resist to form the pattern, based on the corrected amount of exposure; and executing etching process of the film to be processed by use of, as a mask, the resist including the pattern formed thereon.

BRIEF DESCRIPTION OF THE DRAWINGS

FIG. 2 is a characteristic view illustrating a concrete example of the exposure method according to the present invention.

DETAILED DESCRIPTION OF THE PREFERRED EMBODIMENTS

Basic Gist of the Present Invention

Figure 1A:
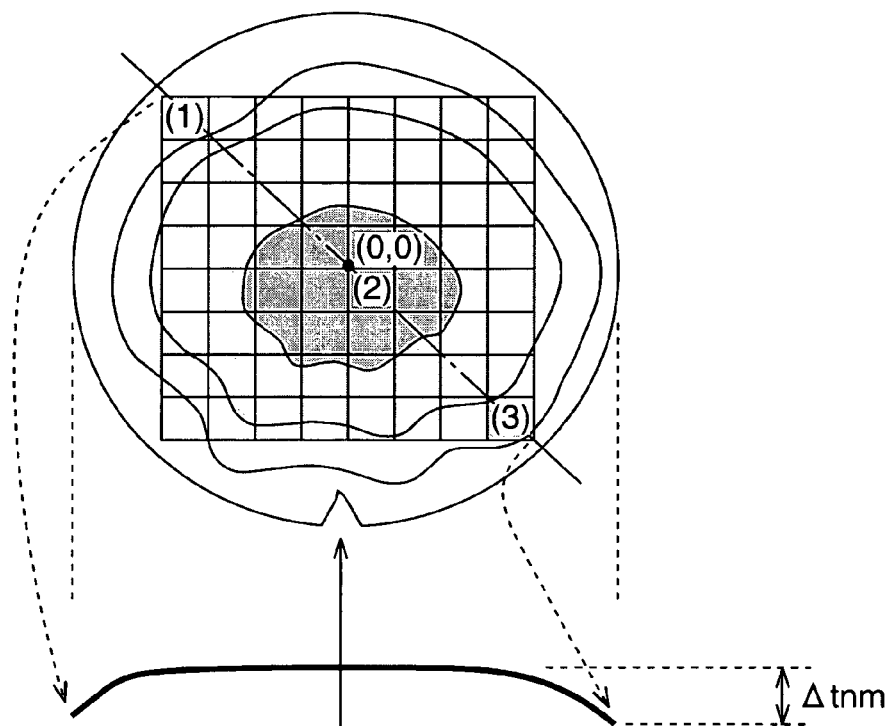
FIGS. 1A and 1B are characteristic views illustrating a concrete example of an exposure method according to the present invention.

During exposure, particularly electron-beam exposure, an electron beam is introduced into a wafer at an accelerated rate to be scattered. The degree of an amount of reflected electrons called backward scattering varies depending on the film thickness and the material of a lower layer structure body lying under a film to be processed with a resist. When there are film-thickness variations among respective positions within the plane of the lower layer structure body, the amount of reflection is proportional to the film thickness of the lower layer structure body. Accordingly, there are influences of the lower layer structure body at the respective positions thereof as follows. If a thin portion of the lower layer structure body exists around patterns to be formed in the film to be processed, the dimensions of the patterns will become smaller. On the contrary, if a thick portion of the lower layer structure body exists around the patterns, the dimensions of the patterns will become greater.

Such influences of the lower layer structure body on pattern dimensions become conspicuous when the lower layer structure body is made of a material with high reflectivity with respect to an electron beam, such as a metal material. The influence of the film thickness of the lower layer structure body is particularly problematic when the patterns are fine and there are great pattern-density differences.

Further, in the case of forming relatively large patterns, the amount of exposure for these patterns is generally set to a lower value, through proximity-effect corrections, in comparison with their peripheral regions. In this case, if the lower layer structure body has a small thickness around these patterns, the amount of exposure for these patterns is further reduced below a target amount of exposure, thus degrading the resolution. This is significantly problematic when the lower layer structure body is, for example, a wiring structure employing copper (Cu) or tungsten (W), since a metal material with a greater atomic number will reflect a greater amount of electrons.

To cope with so-called backward scattering of an electron beam, the present invention suggests exposure corrections as follows, in order to cancel the variation of the amount of reflected electrons due to the film-thickness variation of the lower layer structure body (the in-plane film thickness distribution) for suppressing the variation of pattern dimensions within the plane of the substrate, thus making uniform pattern dimensions.

First, in performing exposure for forming patterns, the film thickness of the lower layer structure body is measured at respective positions within the plane thereof. The film-thickness measurement is performed at, for example, a single to several tens of points within the plane of the substrate in an in-line manner. The measured film thicknesses are fed forward in association with the amount of exposure. Namely, by use of the measured thicknesses, the amount of exposure (the exposure distribution within the plane of the resist) is corrected such that it cancels the reflected amount of exposure based on the in-plane film thickness distribution of the lower layer structure body and, in this case, it is inversely proportional thereto. Thus, on the basis of the corrected amount of exposure, exposure is applied to the resist for forming patterns.

A concrete example of an exposure method according to the present invention will be described using FIGS. 1A, 1B and 2.

Figure 1B:
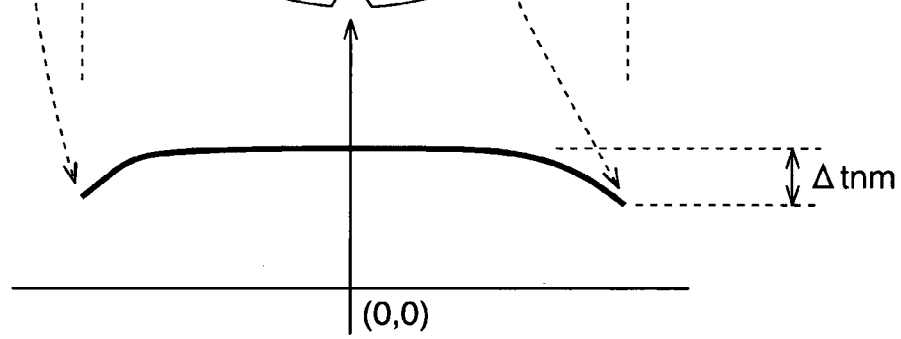

For example, a lower layer structure body on a semiconductor substrate 101 may have an in-plane film thickness distribution, as illustrated in FIGS. 1A and 1B, wherein FIG. 1A is a plan view and FIG. 1B is a cross-sectional view taken along a broken line (1)-(2)-(3) in FIG. 1A. Here, there is exemplified a case of forming, as the lower layer structure body, embedded wirings from a metal material containing at least copper through a so-called damascene process (after applying chemical mechanical polishing (CMP) for flattening the surface of plane). When embedded wirings are formed through the damascene process and then the CMP process is applied thereto, the lower layer structure body tends to have a thicker center portion (illustrated as (2) in FIG. 1A) while having thinner peripheral edges (illustrated as (1) and (3) in FIG. 1A).

Similarly to FIGS. 1A and 1B, when the lower layer structure body has an in-plane film thickness distribution illustrated by (B) in FIG. 2 (the variation in the in-plane film thickness distribution is indicated as Δt), the in-plane pattern-dimension distribution is substantially proportional to the in-plane film thickness distribution as illustrated by (A) in FIG. 2 (the variation of the pattern dimension is indicated as Δw). Here, if Δt is within the range of about 10 nm to 50 nm, Δw is within the range of about 5 nm to 15 nm. In this case, as illustrated by (C) in FIG. 2, the amount of exposure (the exposure distribution within the plane of the resist) is adjusted such that it cancels the in-plane film thickness distribution and, here, it is substantially inversely proportional to the in-plane film thickness distribution (the variation in the exposure distribution is indicated as Δd). Consequently, the in-plane pattern-dimension distribution approaches a uniform straight line from the state shown by (A), namely, Δw approaches 0.

As described above, the present invention suppresses the pattern-dimension variation in view of three-dimensional factors such as the in-plane film thickness distribution of the lower layer structure body (hereinafter, referred to as three-dimensional lower-layer corrections) and concurrently executes proximity-effect corrections in view of two-dimensional factors which have been conventionally executed. By performing both the three-dimensional lower-layer corrections and the two-dimensional proximity-effect corrections, the pattern dimension variation can be further suppressed, thus enabling provision of adequate pattern dimensions. As the two-dimensional proximity-effect corrections, the forward scattering and the backward scattering within a predetermined radius centered at patterns to be exposed are suppressed to correct the variation in pattern dimension. Also, a so-called area-density method may be used for correcting pattern-dimension variations.

Embodiments of the Present Invention

Hereinafter, with reference to the drawing, there will be described, in detail, concrete embodiments in which the present invention is applied to electron-beam exposure. The present invention is not limited to electron-beam exposure and may be applied to exposure for photolithography.

(Structure of the Exposure System)

Figure 3:
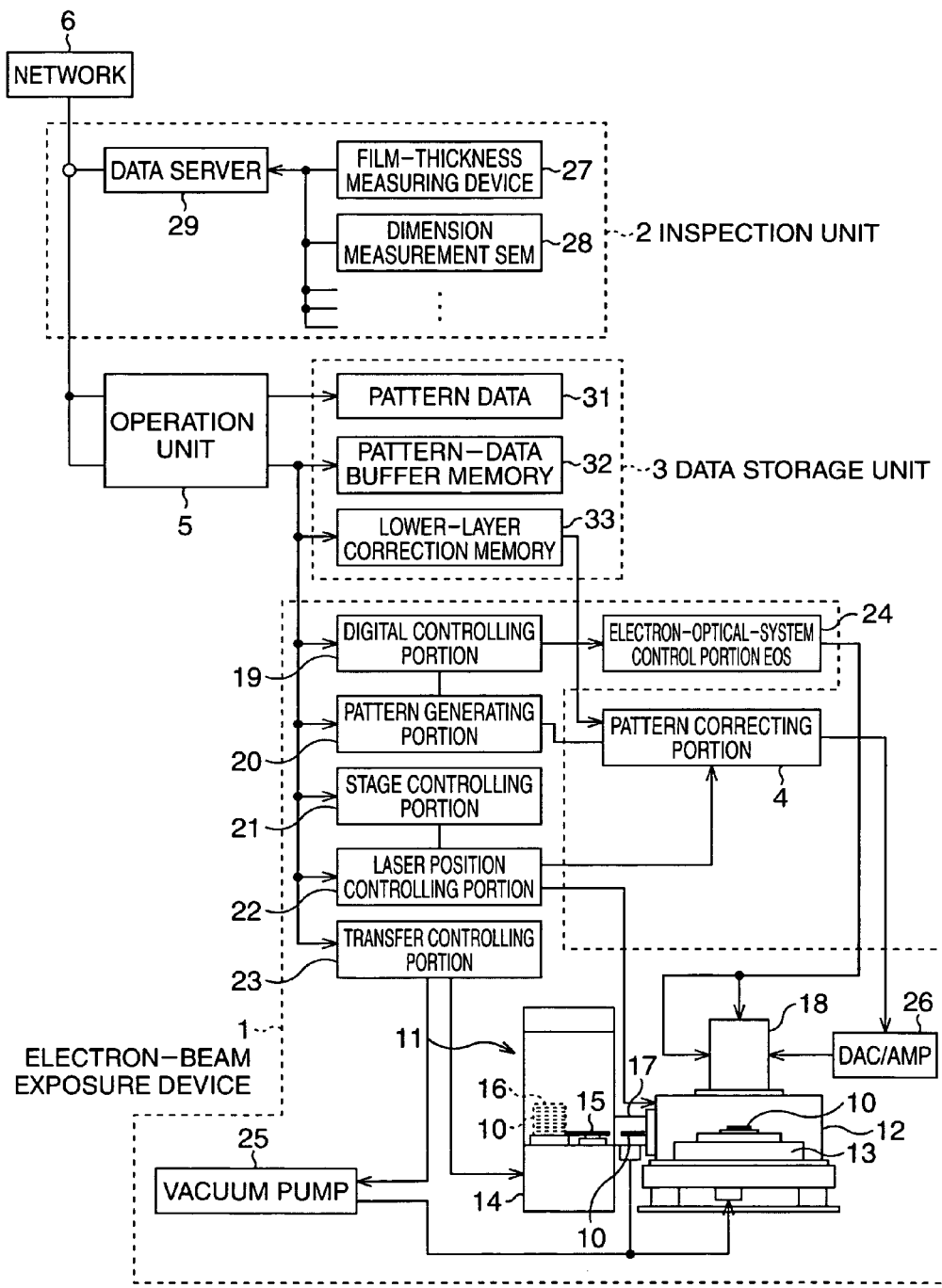
FIG. 3 is a schematic diagram illustrating the general structure of an exposure system according to an embodiment of the present invention.

FIG. 3 is a schematic diagram illustrating the general structure of an exposure system according to the present embodiment.

The exposure system according to the present embodiment is configured to include an electron-beam exposure device 1 for performing exposure with an electron beam, an inspection unit 2 for performing various types of inspections in an in-line manner, a data storage unit 3 for storing various types of information, a pattern correcting portion 4 for performing various types of corrections about exposure for forming patterns and an operation unit 5 which is a user terminal.

The electron-beam exposure device 1 is configured to include a device main body 11 for applying electron-beam exposure to a positioned semiconductor substrate 10, various types of controlling portions 19 to 24, a vacuum pump 25, and a DAC/AMP 26 having an AC/DC conversion function and an amplification function.

The device main body 11 is configured to include an X-Y stage 13 for fixing a semiconductor substrate 10 thereon, a vacuum chamber 12 which surrounds the X-Y stage 13, a column 18 which serves as electron-beam source, a transfer portion 14 for a semiconductor substrate 10, a loading portion 17 which forms a path for transferring the semiconductor substrate 10 from the transfer portion 14 to the vacuum chamber 12, and an electron-optical-system control portion (EOS) 24 for driving and controlling the electron-optical system in the column 18.

The X-Y stage 13 is configured to place and fix, thereon, the semiconductor substrate 10 which is fed from the transfer portion 14 through the loading portion 17, wherein the position of the semiconductor substrate 10 can be finely controlled within the X-Y plane. The vacuum chamber 12 is configured to place the semiconductor substrate 10 to be subjected to exposure inside the chamber and is controlled to a desired vacuum state, by being driven by the vacuum pump 25. The transfer portion 14 is configured to include a wafer carrier 16 for housing plural semiconductor substrates 10 therein, and a transferring arm 15 for extracting a semiconductor substrate 10 from the wafer carrier 16 and transferring it to the loading portion 17. The column 18 is configured to include a high-voltage power supply and an electron gun for generating an electron beam, various types of lenses for shaping the generated electron beam, and a deflecting device for deflecting the electron beam for directing it to a target position on the semiconductor substrate 10, which are not shown.

A digital control portion 19 digitally controls a pattern generating portion 20 and the EOS 24. The pattern generating portion 20 creates data about the positions and the shapes of respective shots, on the basis of pattern data 34 transmitted from a pattern-data buffer memory 32. A stage controlling portion 21 drives the X-Y stage 13 to adjust the position of the semiconductor substrate 10 such that the electron beam is directed to a predetermined position on the surface of the semiconductor substrate 10. A laser position controlling portion 22 recognizes and controls the position at which the semiconductor substrate 10 is placed and fixed on the X-Y stage 13, by use of a laser light. A transfer control portion 23 controls the transfer condition of the semiconductor substrate 10 in the transfer portion 14 and also drives the vacuum pump to adjust the inside of the vacuum chamber 12 to a desired vacuum state.

The inspection unit 2 includes a film-thickness measuring device 27 for measuring the film thicknesses of various patterns which have been formed on the semiconductor substrate 10 through lithography and etching, a measuring device, which is a dimension measurement SEM 28 in this case, for measuring the dimensions of the various patterns (the pattern-width dimensions and the like), and various types of inspection devices such as a position alignment device, which are not shown. These respective devices are connected to a data server 29.

The film-thickness measuring device 27 measures the film thicknesses of the various patterns formed on the semiconductor substrate 10. Here, for each semiconductor substrate 10, the film thicknesses are measured at several positions or several tens of positions within the plane of the semiconductor substrate 10. Here, the aforementioned film-thickness measurement may be performed for a representative semiconductor substrate 10 selected from every lot including plural semiconductor substrates 10 or from every two or more lots and then the average value may be determined for every lot or every two or more lots. In the present embodiment, the film-thickness measuring device 27 measures the film thickness of a lower layer structure body being patterns lying in lower layer of a film to be subjected to surface processing (for example, an interlayer insulating film), particularly the film thickness of a lower layer structure body (for example, wirings) made of a metal material with a high reflectivity with respect to the electron beam, prior to the film-forming of the film to be subjected to surface processing.

As the film-thickness measuring device 27, an optical-interferometry type film-thickness measuring device, for example, is employed. In such a device, light is directed to the formed patterns, the reflected light is dispersed by a spectroscope, the reflected light intensities with respective wavelengths of the dispersed light are detected by a photo detector and, thereafter, these reflected light intensities are compared with predetermined theoretical waveforms corresponding to these patterns to determine the film-thicknesses of the patterns.

Film-thickness data at the respective measurement positions within the plane, which has been determined by the film-thickness measuring device 27, is integrated with coordinate data of the corresponding measurement positions to form a set of data and the set of data is transferred to the data server 29. In the data server 29, the aforementioned set of data is integrated with material data of the lower layer structure body to form lower layer structure body data, and the lower layer structure body data is stored. The data server 29 is connected to the operation unit 5 through a network 6.

The data storage unit 3 is configured to include the pattern-data buffer memory 32 for storing various types of pattern data 34 and a lower-layer correction memory 33 for storing data of the lower layer structure body.

The pattern-data buffer memory 32 stores various types of pattern data 34 for use in applying exposure to the resist formed on the semiconductor substrate 1. The lower-layer correction memory 33 extracts, from the data server 29, the lower layer structure body data of the lower layer structure body determined by the film-thickness measuring device 27 and then stores therein. Here, the film-thickness data is stored in the lower-layer correction memory 33 in association with addresses determined through conversion of the coordinates of the measurement positions, and the data of the material and the conversion factor are set with a predetermined exposure scheduler. With this structure, the lower layer structure body data can be efficiently fed forward to the exposure for the patterns.

The pattern correcting portion 4 performs various types of corrections for the exposure for pattern data. These corrections mainly include corrections of the shot size, the focusing, the distortion and the deflection position.

As corrections about the lower-layer film, more specifically, the pattern correcting portion 4 performs so-called lower-layer corrections for suppressing the three-dimensional influence, namely the influence of the film-thickness distribution of the lower-layer structure body lying under a subject layer as an object to be processed with the resist, in the event of exposing pattern-wise the resist on the semiconductor substrate 10 associated with the pattern data 34. Namely, the pattern correcting portion 4 reads desired pattern data 34 from the pattern-data buffer memory 32 and also reads, from the lower-layer correction memory 33, the lower layer structure body data corresponding to the lower layer structure body of the film to be processed on which the patterns are to be formed. Here, the pattern correcting portion 4 reads sequentially, out of the lower layer structure body data, data of the portion corresponding to the exposure region.

Then, the pattern correcting portion 4 adjusts the amount of exposure within the plane such that the amount of exposure cancels the in-plane film-thickness distribution of the lower-layer structure body within the respective exposure regions (the amount of exposure is inversely proportional to the in-plane film-thickness distribution). Here, in determining the in-plane film-thickness distribution, a primary approximation (linear approximation) function is determined on the basis of the film thicknesses at the coordinates of the respective measurement positions, and the in-plane film-thickness distribution is determined through approximation using this function. As a matter of course, instead of a linear approximation, a several order approximation (curve approximation) function may be determined and employed.

Further, the pattern-correcting portion 4 performs corrections of the shot size, the shot position and the two-dimensional influence, namely corrections of the two-dimensional proximity-effects. As the two-dimensional proximity-effect corrections, the pattern-correcting portion 4 suppresses the forward scattering and the backward scattering within a predetermined radius centered at the pattern being formed with the exposure to correct pattern dimension variations. Also, corrections of the pattern dimension variations may be executed through a so-called area-density method.

Moreover, the pattern-correcting portion 4 performs corrections of the focusing, the distortion, the reduction ratio, the stage position and the like, at respective exposure regions.

The operation unit 5 is, for example, a work station or a personal computer and is for operating and controlling the electron-beam exposure device 1, the data storage unit 3, the pattern generating portion 20 and the pattern correcting portion 4.

In forming, through exposure, patterns based on the pattern data 34 on the resist formed on the semiconductor substrate 10, an operator operates the operation unit 5 as will be described below. The operator extracts the lower layer structure body data from the data server 29 and stores it in the lower-layer correction memory 33. Then, the operator reads desired pattern data 34 from the pattern-data buffer memory 32 and transfers it to the pattern generating portion 20. Further, the operator causes the pattern generating portion 20 to create data of the positions and the shapes of respective shots on the basis of the pattern data 34 and causes the pattern correcting portion 4 to execute various types of corrections including the aforementioned three-dimensional lower-layer corrections and the two-dimensional proximity-effect corrections. The data resulted from the various types of corrections is output to the column 18 through the DAC/AMP 26. Then, on the basis of this result of corrections, exposure is performed. Since the lower layer structure body is patterns and the like formed on the lower-layer of the film subjected to processing, the result of the lower-layer corrections is fed forward to this exposure.

Figure 4A:
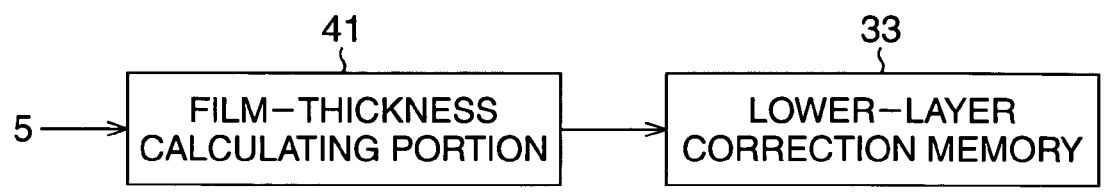
FIGS. 4A and 4B are block diagrams illustrating main component parts according to a modified example of the embodiment of the present invention.
Figure 4B:
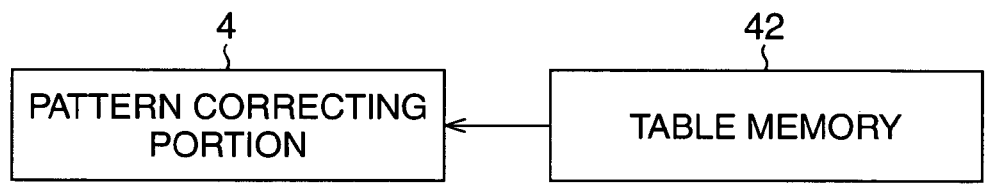

Hereinafter, there will be described respective modified examples of the present embodiment. FIGS. 4A and 4B are block diagrams showing the main components of the respective modified examples.

First, FIG. 4A shows a first modified example. The exposure system according to the first modified example includes a film-thickness calculating portion 41 connected to the operation unit 5 and the lower-layer correcting memory 33, in addition to the respective components of the exposure system according to the present embodiment.

The film-thickness calculating portion 41 divides the plane of the lower layer structure body into plural regions and calculates the film thicknesses of the respective regions resulted from the division, by use of the film-thickness data which has been measured by the film-thickness measuring device 27 at measurement positions within the plane. Then, the film-thickness calculating portion 41 integrates the film-thicknesses of the respective regions with coordinate data indicating the respective regions and material data of the lower-layer structure body to form lower-layer structure body data and then transfers it to the lower-layer correction memory 33. The transferred lower-layer structure body data is stored in the lower-layer correction memory 33.

As the method for dividing the plane, the plane of the lower-layer structure body may be divided into plural rectangular-shaped regions or divided into plural regions through a two or more order curve approximation equation.

In the first modified example, in order to execute the lower-layer corrections, the pattern-correcting portion 4 reads desired pattern data 34 from the pattern-data buffer memory 32 and reads, from the lower-layer correction memory 33, the lower-layer structure body data corresponding to the lower-layer structure body of the film subjected to processing on which the pattern is to be formed. Since the film-thickness data, out of the lower layer structure body data, is determined for the respective plural regions dividing the plane of the lower layer structure body as described above, the pattern correcting portion 4 reads sequentially, the data of the region corresponding to each exposure region, out of the lower layer structure body data. Then, the pattern correcting portion 4 adjusts the amount of exposure within the plane such that the amount of exposure cancels the in-plane film-thickness distribution of the lower-layer structure body in the respective exposure regions (the amount of exposure is inversely proportional to the in-plane film-thickness distribution). Here, since the film-thickness data is determined in advance by the film-thickness calculating portion 41 for the respective regions, the pattern-correcting portion 4 can rapidly and easily adjust the amount of exposure.

Next, FIG. 4B illustrates a second modified example. The exposure system according to the second modified example includes a table memory 42 for storing a correction table for the lower-layer corrections which is connected to the pattern-correcting portion 4, in addition to the respective components of the exposure system according to the present embodiment.

The correction table defines, in advance, exposure-correction factors such that they cancel the in-plane film-thickness distribution (they are inversely proportional to the in-plane film-thickness distribution), in correspondence to the material and the film-thickness of the lower layer structure body.

In the second modified example, in order to execute the lower-layer corrections, the pattern correcting portion 4 reads desired pattern data 34 from the pattern-data buffer memory 32 and reads, from the lower-layer correction memory 33, the lower-layer structure body data corresponding to the lower-layer structure body of the film subjected to processing on which the pattern is to be formed (similarly to the present embodiment, a set of data constituted by the film-thickness data at the respective measurement positions within the plane, the coordinate data of the corresponding measurement positions and the material data of the lower-layer structure body). Here, the pattern-correcting portion 4 reads sequentially, the data of the region corresponding to the exposure region, out of the lower-layer structure body data.

Then, the pattern-correcting portion 4 determines the exposure-correction factor in correspondence to the lower-layer structure body data (the material data and the film-thickness data thereof) by use of the correction table read from the table memory 42 and then adjusts the amount of exposure by use of the exposure-correction factor. As described above, in the second modified example, since the pattern-correcting portion 4 adjusts the amount of exposure by use of the correction table containing pre-determined exposure-correction factors, the pattern-correcting portion 4 easily and rapidly adjust the amount of exposure.

(Method for Manufacturing a Semiconductor Device)

Figure 5:
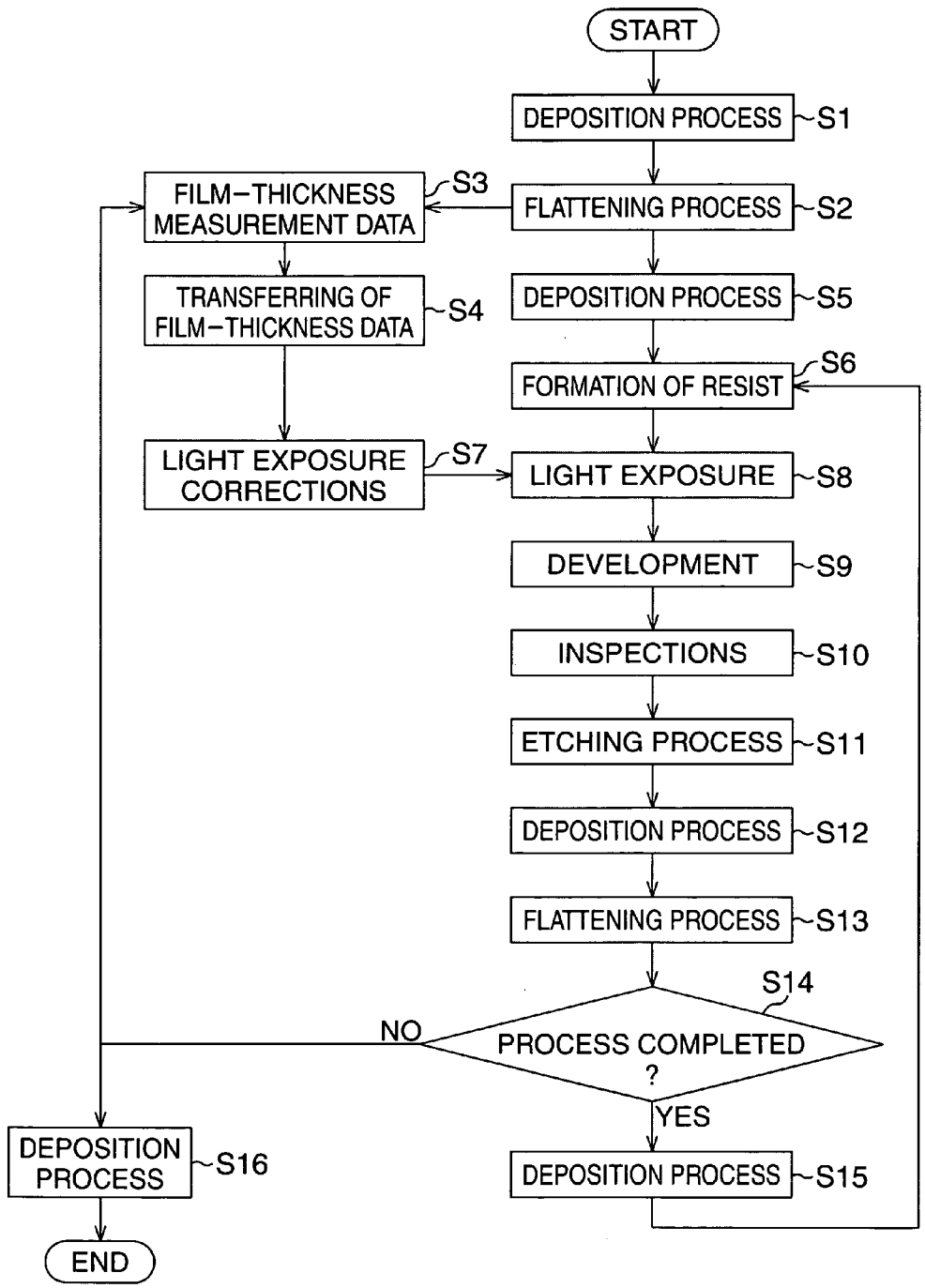
FIG. 5 is a flow chart showing, in the order of steps, a semiconductor-device manufacturing method including an exposure method employing the exposure system according to the present embodiment.

FIG. 5 is a flow chart showing, in the order of steps, a semiconductor-device manufacturing method including an exposure method employing the exposure system according to the present embodiment. FIGS. 6A to 7D are partial cross-sectional views illustrating the states of a wiring layer in correspondence to predetermined steps.

Here, there will be exemplified a case of forming multiple embedded wiring layers from a metal material containing at least copper, through a so-called damascene process. More specifically, there will be described a case of forming, on a predetermined wiring layer, an interlayer insulation film in which a next wiring layer is to be embedded and then forming groove patterns in the interlayer insulation film, when forming the next wiring layer by laminating on the predetermined wiring layer. Further, here, there will be exemplified only the lower-layer corrections which are the characteristic of the present invention, out of various types of corrections.

First, at a step S1, in forming a predetermined wiring layer, a metal material (Cu or an alloy containing Cu) filling groove patterns formed in an interlayer insulation layer therein is deposited.

Figure 6A:
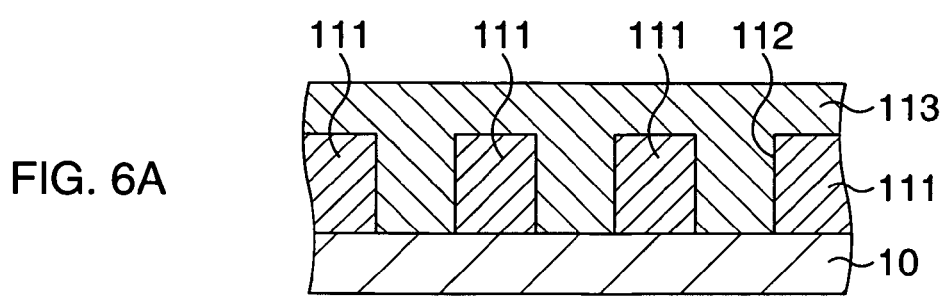
FIGS. 6A to 6E are partial cross-sectional views illustrating the states of a wiring layer in correspondence to predetermined steps, in the semiconductor device manufacturing method according to the present embodiment.

More specifically, as illustrated in FIG. 6A, an interlayer insulation film 111 including wiring-shaped groove patterns 112 formed therein has been deposited on a semiconductor substrate 10, and a metal material 113 is deposited through, for example, plating, such that it fills the groove patterns 112. Here, although not illustrated in the figure, there have been formed, for example, some wiring layers and various types of semiconductor devices such as MOS transistors and memories, under the interlayer insulation film 111.

Subsequently, at a step s2, the surface or plane of the metal material is flattened to form wirings made of the metal material filling the groove patterns.

Figure 6B:
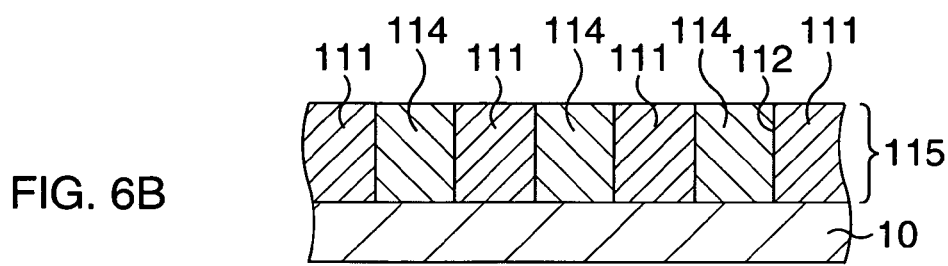

More specifically, as illustrated in FIG. 6B, the metal material 113 is flattened through the CMP using the plane of the interlayer insulation film 111 as a polishing stopper. At this time, wirings 114 filling the groove pattern 112 with the metal material 113 are formed. Thus, the formation of a wiring layer 115 made of the interlayer insulation film 111 and the wirings 114 embedded therein are completed. In the present embodiment, the wiring layer 115 is used as the aforementioned lower layer structure body.

Subsequently, at a step S3, the film-thickness of the wiring layer is measured.

Figure 6C:
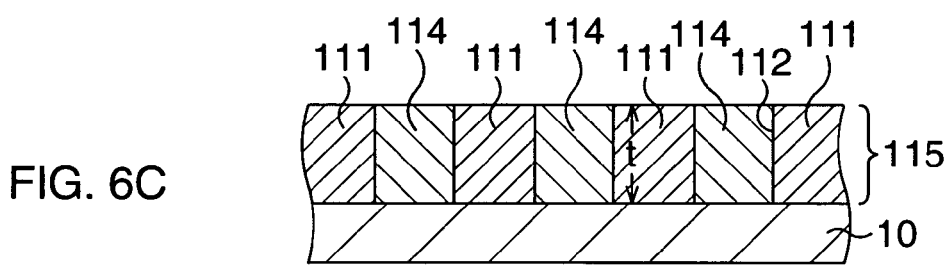

More specifically, using the film-thickness measuring device 27 of the exposure system, the film thickness of the wiring layer 115 is measured and, more specifically, the film-thicknesses t of the respective wirings 114 constituting the wiring layer are measured at plural points within the plane of the wiring layer 115, as illustrated in FIG. 6C. Here, the number of the measurement points may be only one (or two or three). In this case, when performing the lower-layer corrections which will be described later, a comparison is made between the film-thicknesses at the measurement points and a predetermined reference film-thickness for performing corrections.

Subsequently, at a step S4, the operation unit 5 transfers the film-thickness data created by the film-thickness measuring device 27 to the data server 29, along with coordinate data of the corresponding positions, as a set of data. The data server 29 integrates the aforementioned set of data with the material data of the metal material 113 to form lower layer structure body data and then stores the lower layer structure body data.

Figure 6D:
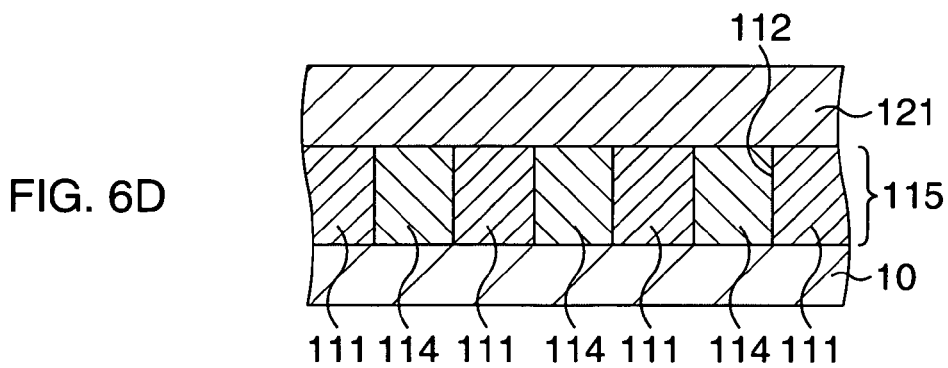

Subsequently, at a step S5, as illustrated in FIG. 6D, an interlayer insulation film 121 is formed such that it covers the wiring layer 115, in order to form the next wiring layer.

Figure 6E:
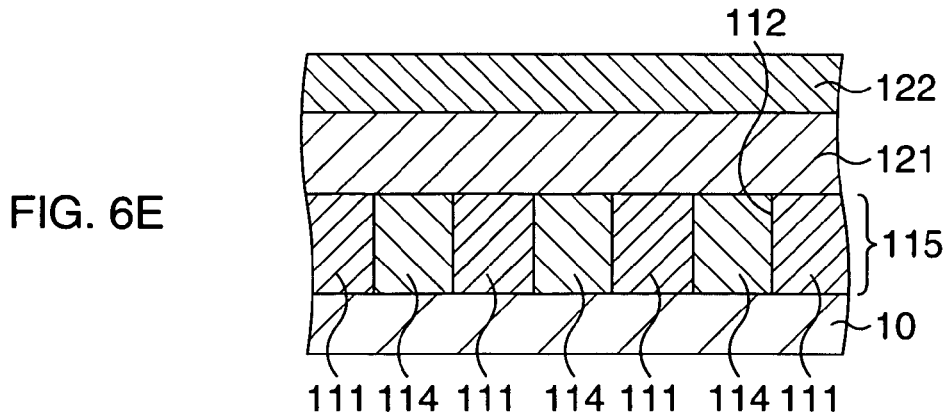

Subsequently, at a step S6, as illustrated in FIG. 6E, a resist 122 is applied to the interlayer insulation film 121, in order to form groove patterns in the interlayer insulation film 121.

Subsequently, at a step S7, the amount of exposure for applying exposure to the resist 122 is corrected.

More specifically, the lower-layer corrections are executed, by use of the pattern-correcting portion 4 of the exposure system. First, the operation unit 5 extracts the lower layer structure body data of the wiring layer 115 from the data server 29 and stores it in the lower-layer correction memory 33. Then, the operation unit 5 reads desired pattern data 34 from the pattern-data buffer memory 32 and transfers it to the pattern generating portion 20. Then, the operation unit 5 causes the pattern generating portion 20 to create data of the positions, the shapes and the like of respective shots on the basis of the pattern data 34 and causes the pattern correcting portion 4 to execute the aforementioned three-dimensional lower-layer corrections. The result of the corrections is fed forward to a step S8 as the next process.

Subsequently, at the step S8, on the basis of the result of corrections of the step S7 (and the result of other corrections), exposure is applied to the resist 122 for forming the groove patterns.

Figure 7A:
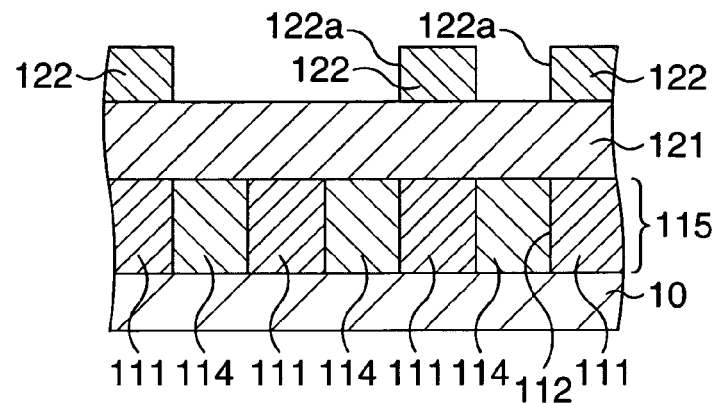
FIGS. 7A to 7D are partial cross-sectional views illustrating, subsequently to FIGS. 6A to 6E, the states of a wiring layer in correspondence to predetermined steps, in the semiconductor device manufacturing method according to the present embodiment.

Subsequently, at a step S9, the resist 122 is developed. At this time, as illustrated in FIG. 7A, groove patterns 122a are formed in the resist 122.

Then, various types of inspections of pattern dimensions and the like are performed by use of a SEM (step S10).

Subsequently, at a step S11, etching is applied to the interlayer insulation film.

Figure 7B:
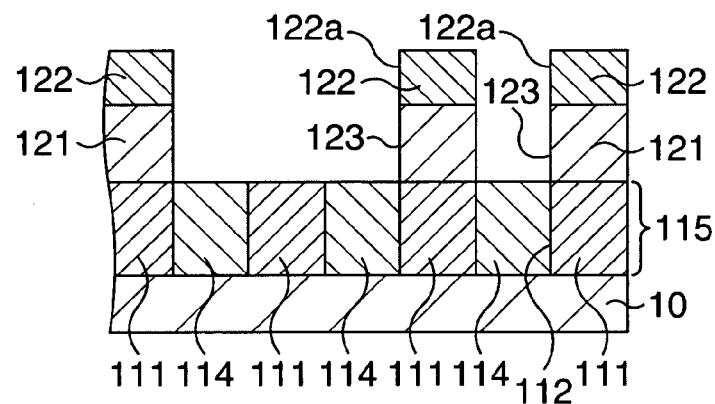

More specifically, as illustrated in FIG. 7B, dry etching is applied to the interlayer insulation film 121 by using the resist 122 as a mask. Consequently, groove patterns 123 with shapes following the groove patterns 122a in the resist 122 are formed in the interlayer insulation film 121.

Subsequently, at a step S12, similarly to the step S1, a metal material (Cu or an alloy containing Cu) filling the groove patterns formed in the interlayer insulation film is deposited.

Figure 7C:
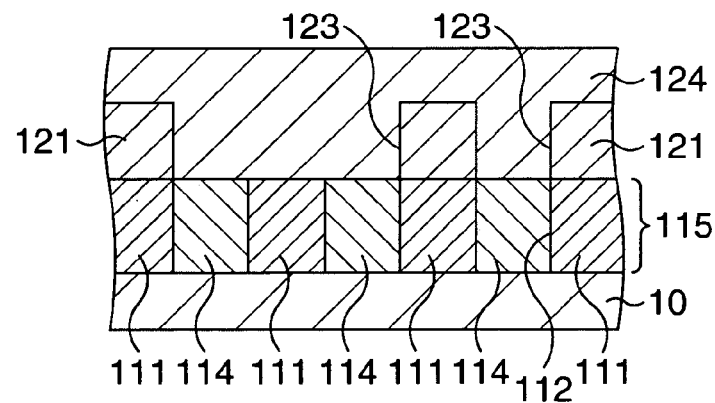

More specifically, as illustrated in FIG. 7C, a metal material 124 is deposited through, for example, plating such that it fills the groove patterns 123 in the interlayer insulation film 121.

Then, at a step S13, similarly to the step S2, the surface or plane of the metal material is flattened to form wirings made of the metal material filling the groove patterns.

Figure 7D:
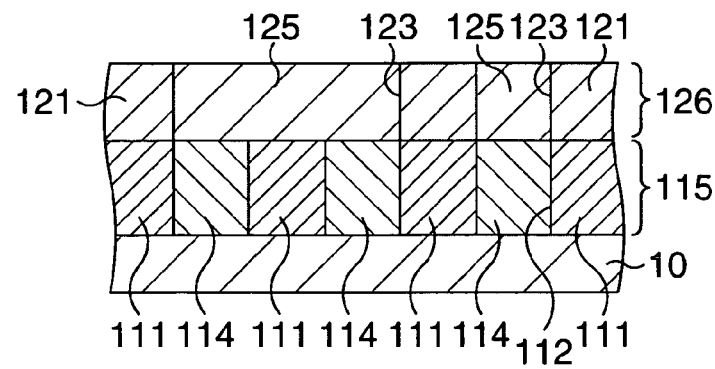

More specifically, as illustrated in FIG. 7D, the metal material 124 is flattened through the CMP by using the plane of the interlayer insulation film 121 as a polishing stopper. At this time, wirings 125 made of the metal material 124 filling the groove patterns 123 are formed. Thus, the formation of a wiring layer 126 made of the interlayer insulation film 121 and the wirings 125 embedded therein are completed.

Subsequently, at a step S14, the operation unit 5 determines whether or not the wiring layer 126 is the uppermost layer of the multiple wiring layers, namely whether or not the fabrication process for the multiple wiring layers should be completed.

When it is determined that the fabrication process should be completed, the process proceeds to a step S15. On the other hand, when it is not determined that the fabrication process should be completed, the process proceeds to a step S16, and the step S3 is repeatedly executed. In this case, the wiring layer 126 forms the aforementioned lower-layer structure body.

At a step S15, an insulation film (not shown) covering the multiple wiring layers is formed. In this insulation film, pad electrodes and the like which are connected to the multiple wiring layers will be formed at the next process.

On the other hand, at a step S16, similarly to the step S5, an interlayer insulation film (not shown) is formed such that it covers the wiring layer 126, in order to form the next wiring layer. Then, the steps S6 to S14 are executed again, using the wiring layer 126 as the lower-layer structure body.

As described above, with the present embodiment, in performing exposure for forming patterns being fine as well as having great density difference, it is possible to execute adequate corrections for suppressing the influence from peripheries of these patterns to be a minimum and for suppressing the dimension variation within the plane of semiconductor substrate or among semiconductor substrates to a minimum. This enables rapidly performing exposure for forming such patterns with desired dimensions and realizes reliable semiconductor devices satisfying the requirement of further miniaturization and integration of components such as various types of devices.

Other Embodiments of the Present Invention

The functions of the respective components constituting the exposure system according to the aforementioned embodiments and the modified examples thereof (except the inspection unit 2, the data storage unit 3, the table memory 42, the operation unit 5, the device main body 11 and the vacuum pump 25) and the respective steps (the steps S1 to S16 and the like in FIG. 5) of the semiconductor device manufacturing method including the exposure method can be realized by operating programs stored in RAMs or ROMs of a computer. The present invention covers the programs and the computer-readable storage mediums storing the programs.

More specifically, the aforementioned programs are recorded in a recording medium such as a CD-ROM or supplied to the computer through various types of transmission mediums. As the recording medium for recording the aforementioned programs, it is possible to employ a flexible disk, a hard disk, a magnetic tape, a magnetic optical disk, a non-volatile memory card or the like, as well as a CD-ROM. On the other hand, as the mediums for transferring the aforementioned programs, it is possible to employ communication mediums (wired circuits such as optical fibers or wireless circuits) in computer network (LAN, WAN such as Internet, wireless communication network, or the like) systems for transferring and supplying program information as carrier waves.

In the case where such programs are operated in cooperation with the OS (operating system) operated in the computer or other application software and the like to realize the functions of the aforementioned embodiments or in the case where all or a portion of the processing of the supplied programs is executed by a function expansion board or a function expansion unit to realize the functions of the aforementioned embodiment, as well as the case where the computer executes supplied programs to realize the functions of the aforementioned embodiment, the present invention covers such programs.

Figure 8:
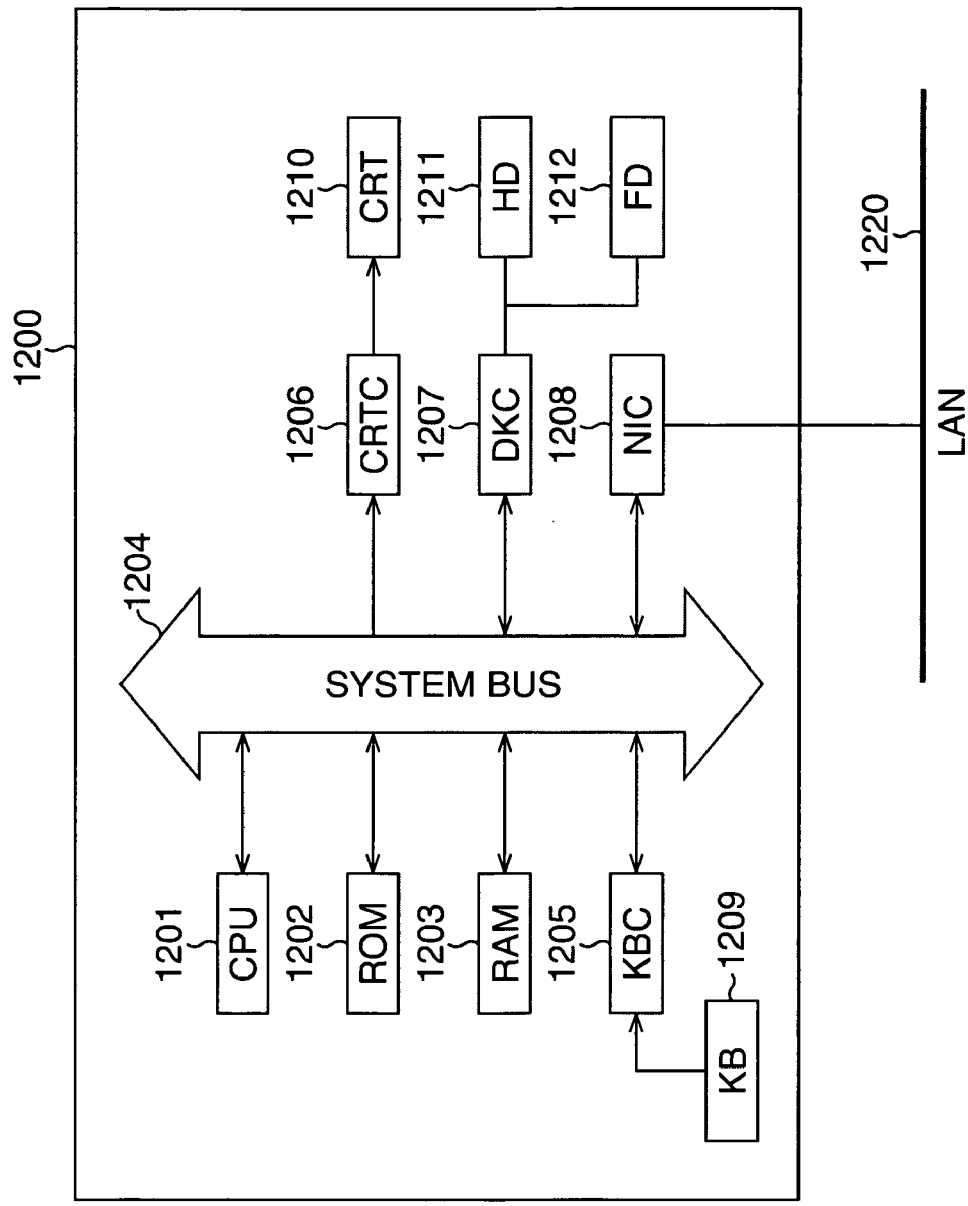
FIG. 8 is a schematic diagram illustrating the internal structure of a personal user terminal equipment.

For example, FIG. 8 is a schematic diagram illustrating the internal structure of a personal user terminal equipment. In FIG. 8, 1200 is a computer PC. The PC 1200 includes a CPU 1201 and executes device controlling software which is stored in a ROM 1202 or a hard disk (HD) 1211 or is supplied to the PC 1200 from a flexible disk drive (FD) 1212 for overall controlling the respective devices connected to a system bus 1204.

The processes and the like at the steps S1 to S16 in FIG. 5 in the present embodiment are realized by programs stored in the CPU 1201, the ROM 1202 or the hard disk (HD) 1211 in the PC 1200.

1203 is a RAM which functions as a main memory, a work area and the like of the CPU 1201. 1205 is a keyboard controller (KBC) which controls a keyboard (KB) 1209 or command inputs from devices which are not shown.

1206 is a CRT controller (CRTC) which controls the display of a CRT display (CRT) 1210. 1207 is a disk controller (DKS) which controls the accesses to the flexible disk (FD) 1212 and the hard disk (HD) 1211 storing booting programs (activation programs: programs for starting the execution (operation) of hardware or software in the personal computer), plural applications, edition files, user files and network management programs and the like.

1208 is a network interface card (NIC) which receives and transmits data bi-directionally from and to a network printer, other network apparatuses or other PCs, through a LAN 1220.

According to the present invention, in the event of exposing patterns being fine as well as having great density differences, it is made possible to perform adequate corrections so as to suppress any influence from peripheries of these patterns to be a minimum and to suppress any dimension variation within the plane of semiconductor substrate or among semiconductor substrates to be a minimum. Thereby it is made possible to form patterns with desired dimensions to the extent possible so as to realize reliable semiconductor devices capable of meeting the requirements of making structures such as various elements in semiconductor devices being yet finer and highly integrated in terms of elements such as various types of devices.

What is claimed is:

1. An exposure method for exposing pattern wise the resist formed on a semiconductor substrate to form a pattern, the exposure method comprising:

measuring a film thickness of a lower layer structure body lying under a subject film as an object to be processed with said resist, at respective positions within a plane thereof, in the event of exposing said pattern;

correcting an amount of exposure such that the amount of exposure is inversely proportional to an in-plane film thickness distribution of said lower layer structure body, based on the measured film thicknesses of said lower layer structure body; and exposing pattern wise the resist to form the pattern based on said corrected amount of exposure.

2. The exposure method according to claim 1, further comprising storing information about said lower layer structure body including information about said respective positions and information about the corresponding film thicknesses, after measuring said film thicknesses.

3. The exposure method according to claim 1, wherein the measuring said film thickness includes measuring said film thickness for each individual semiconductor substrate.

4. The exposure method according to claim 2, wherein the measuring said film thickness includes measuring said film thickness of an arbitrary single semiconductor substrate, out of a plurality of said semiconductor substrates defined as one unit.

5. The exposure method according to claim 1, wherein said lower layer structure body is made of a metal material.

6. The exposure method according to claim 1, wherein the exposing pattern wise the resist to form the pattern includes executing of exposure by use of an electron beam.

7. A semiconductor device manufacturing method comprising:

measuring a film thickness of a lower layer structure body lying under a subject film as an object to be processed with a resist, at positions within a plane thereof, in the event of exposing pattern wise the resist formed on a semiconductor substrate to form a pattern;

correcting an amount of exposure such that the amount of exposure is inversely proportional to an in-plane film thickness distribution of said lower layer structure body, by using the measured film thicknesses of said lower layer structure body, when said lower layer structure body is made of a material with a higher reflectivity with respect to exposure than that of said film to be processed;

exposing pattern wise the resist to form the pattern, based on said corrected amount of exposure; and executing etching process of said film to be processed using, as a mask, said resist including said pattern formed thereon.

8. The semiconductor device manufacturing method according to claim 7, further comprising the storing information about said lower layer structure body including information about said respective positions and information about the corresponding film thicknesses, after the measuring said film thickness.

9. The semiconductor device manufacturing method according to claim 7, wherein the measuring said film thickness includes measuring said film thickness for each individual semiconductor substrate.

10. The semiconductor device manufacturing method according to claim 7, wherein the measuring said film thickness includes measuring said film thickness of an arbitrary single semiconductor substrate, from among a plurality of said semiconductor substrates handled as one unit.

11. The semiconductor device manufacturing method according to claim 7, wherein the exposing pattern wise the resist to form the pattern includes performing exposure by use of an electron beam.

* * * * *